(12) United States Patent
Chang et al.

(10) Patent No.: US 10,354,878 B2
(45) Date of Patent: Jul. 16, 2019

(54) DOPING METHOD FOR SEMICONDUCTOR DEVICE

(71) Applicant: United Microelectronics Corp., Hsinchu (TW)

(72) Inventors: Kai-Kuen Chang, Keelung (TW); Shih-Yin Hsiao, Chiayi County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 15/402,970

(22) Filed: Jan. 10, 2017

(65) Prior Publication Data

US 2018/0197742 A1    Jul. 12, 2018

(51) Int. Cl.
| | | |
|---|---|---|
| H01L 29/10 | (2006.01) | |
| H01L 21/265 | (2006.01) | |
| H01L 21/266 | (2006.01) | |
| H01L 27/11556 | (2017.01) | |
| H01L 27/11582 | (2017.01) | |

(52) U.S. Cl.
CPC ...... *H01L 21/26513* (2013.01); *H01L 21/266* (2013.01); *H01L 21/26586* (2013.01); *H01L 27/11556* (2013.01); *H01L 27/11582* (2013.01); *H01L 29/1095* (2013.01)

(58) Field of Classification Search
CPC ......... H01L 27/11582; H01L 27/11556; H01L 21/823807; H01L 21/823412; H01L 21/823493; H01L 29/1095
See application file for complete search history.

(56) References Cited

U.S. PATENT DOCUMENTS

| | | | |
|---|---|---|---|
| 5,578,865 A | 11/1996 | Vu et al. | |
| 6,153,478 A | 11/2000 | Lin et al. | |
| 6,225,187 B1 | 5/2001 | Huang et al. | |
| 6,362,035 B1 * | 3/2002 | Shih ................. | H01L 21/76237 257/369 |
| 7,560,324 B2 * | 7/2009 | Chidambaram .... | H01L 29/0619 257/E21.427 |
| 2006/0040464 A1 * | 2/2006 | Jung ................. | H01L 21/76229 438/424 |
| 2017/0256537 A1 * | 9/2017 | Wu ....................... | H01L 27/088 |

* cited by examiner

*Primary Examiner* — Zandra V Smith
*Assistant Examiner* — John M Parker
(74) *Attorney, Agent, or Firm* — J.C. Patents

(57) ABSTRACT

A doping method for a semiconductor device including the following steps is provided. A substrate is provided. The substrate has a channel region. The channel region includes a first edge region, a second edge region and a center region in a channel width direction substantially perpendicular to a channel length direction, and the center region is located between the first edge region and the second edge region. A first doping process is performed on the first edge region, the second edge region and the center region by using a first conductive type dopant. A second doping process is performed on the center region by using a second conductive type dopant.

15 Claims, 6 Drawing Sheets

DOPING METHOD FOR SEMICONDUCTOR DEVICE

BACKGROUND OF THE INVENTION

Field of the Invention

The invention relates to a semiconductor process, and particularly relates to a doping method for a semiconductor device.

Description of Related Art

As integration increases, isolation structures are now of great portance for isolating individual devices in high integration integrated circuits. However, divots are usually formed around the top corners of the isolation structures. The divot tends to accumulate charges and consequently reduces the threshold voltage (Vt) at the edge region of the channel region and induces sub-threshold leakage current, which is so-called the kink effect or the double-hump. Further, the kink effect and the double-hump may cause the reduction in the electrical performance and yield of the semiconductor device.

SUMMARY OF THE INVENTION

The invention provides a doping method for a semiconductor device, which can prevent the kink effect and the double-hump.

The invention provides a doping method for a semiconductor device, which includes the following steps. A substrate is provided. The substrate has a channel region. The channel region includes a first edge region, a second edge region and a center region in a channel width direction substantially perpendicular to a channel length direction, and the center region is located between the first edge region and the second edge region. A first doping process is performed on the first edge region, the second edge region and the center region by using a first conductive type dopant. A second doping process is performed on the center region by using a second conductive type dopant.

According to an embodiment of the invention, in the doping method for the semiconductor device, a ratio of a width of the first edge region to a total width of the first edge region, the second edge region and the center region is 2% to 30%, for example.

According to an embodiment of the invention, in the doping method for the semiconductor device, a ratio of a width of the second edge region to a total width of the first edge region, the second edge region and the center region is 2% to 30%, for example.

According to an embodiment of the invention, in the doping method for the semiconductor device, the first doping process is a well implantation process, for example.

According to an embodiment of the invention, in the doping method for the semiconductor device, the first doping process may include the following steps. A first patterned photoresist layer exposing an active region is formed on the substrate, wherein the channel region is located in the active region. An ion implantation process is performed on the active region exposed by the first patterned photoresist layer.

According to an embodiment of the invention, the doping method for the semiconductor device may further include removing the first patterned photoresist layer after performing the ion implantation process on the active region exposed by the first patterned photoresist layer.

According to an embodiment of the invention, in the doping method for the semiconductor device, the second doping process may include the following steps. A second patterned photoresist layer exposing the center region is formed. An ion implantation process is performed on the center region exposed by the second patterned photoresist layer.

According to an embodiment of the invention, the doping method for the semiconductor device may further include removing the second patterned photoresist layer after performing the ion implantation process on the center region exposed by the second patterned photoresist layer.

According to an embodiment of the invention, in the doping method for the semiconductor device, the second doping process is performing a tilt angle ion implantation process on the center region exposed by the first patterned photoresist layer, for example.

According to an embodiment of the invention, the doping method for the semiconductor device may further include removing the first patterned photoresist layer after performing the tilt angle ion implantation process on the center region exposed by the first patterned photoresist layer.

According to an embodiment of the invention, in the doping method for the semiconductor device, the first conductive type dopant is one of an N-type dopant and a P-type dopant, for example.

According to an embodiment of the invention, in the doping method for the semiconductor device, the second conductive type dopant is another one of the N-type dopant and the P-type dopant, for example.

According to an embodiment of the invention, in the doping method for the semiconductor device, the semiconductor device is a high voltage semiconductor device, for example.

Based on the above description, in the doping method for the semiconductor device according to the invention, since the second doping process is performed on the center region by using the second conductive type dopant (the anti-type type dopant), the kink effect and the double-hump can be prevented. Therefore, the electrical performance and yield of the semiconductor device can be improved.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
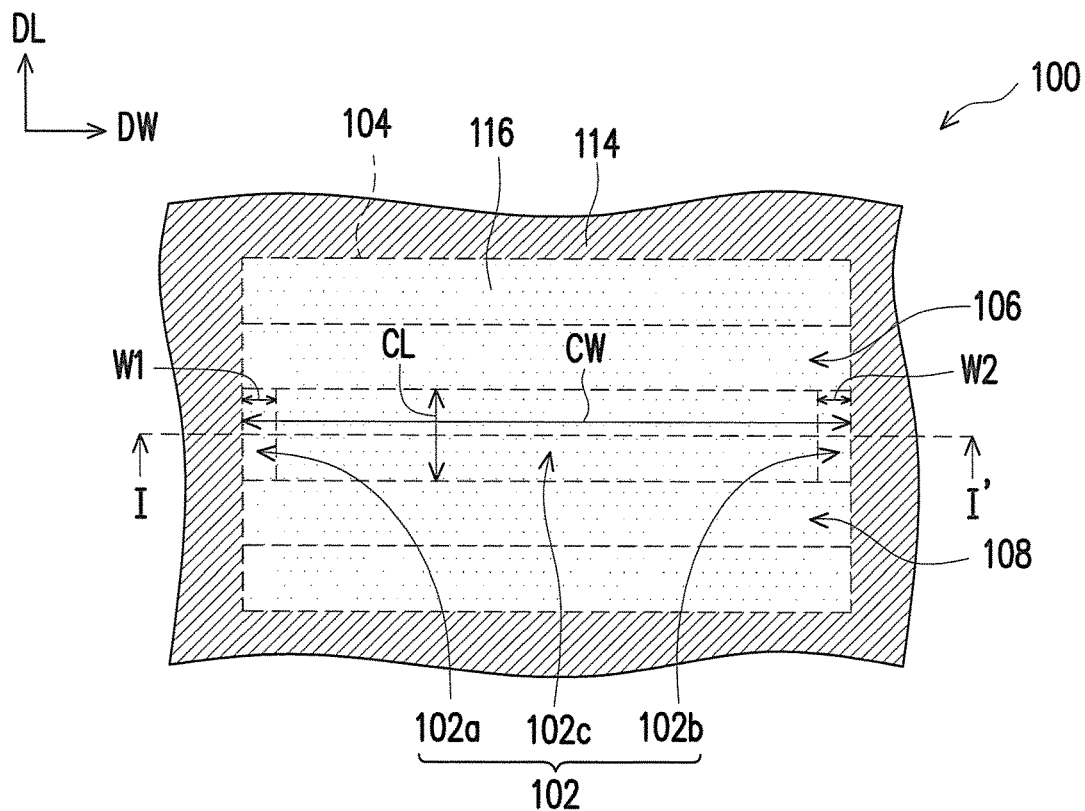
FIG. 1A to FIG. 1C are top views illustrating a doping process for a semiconductor device according to an embodiment of the invention.
Figure 1B:
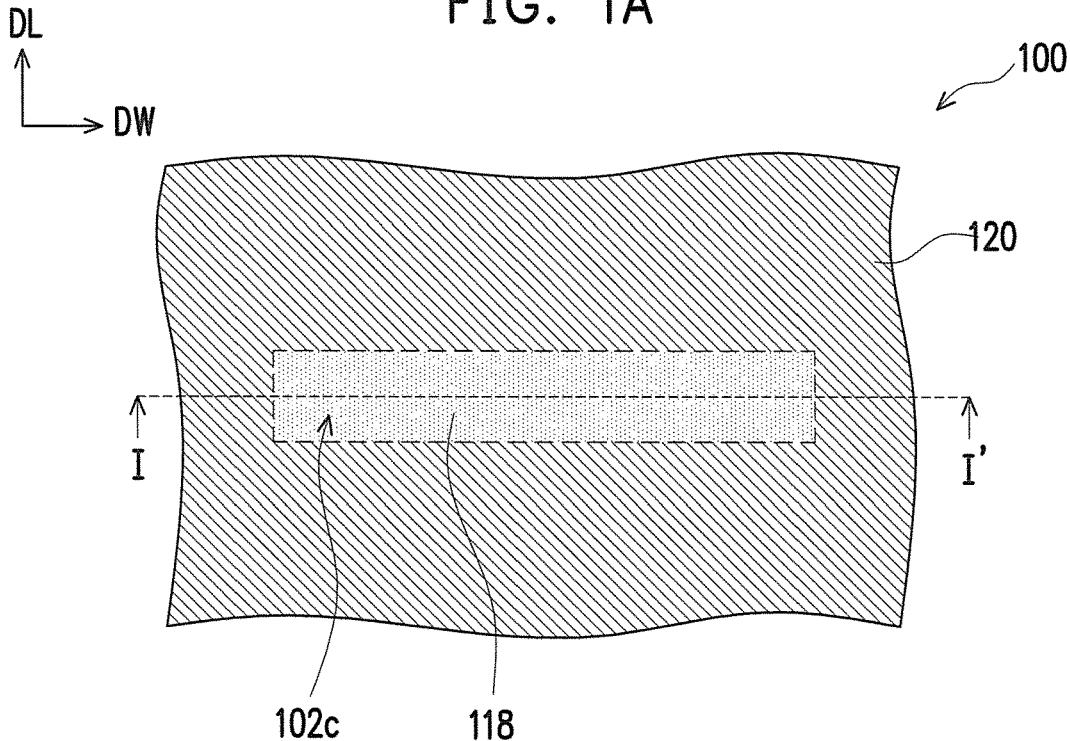
Figure 1C:
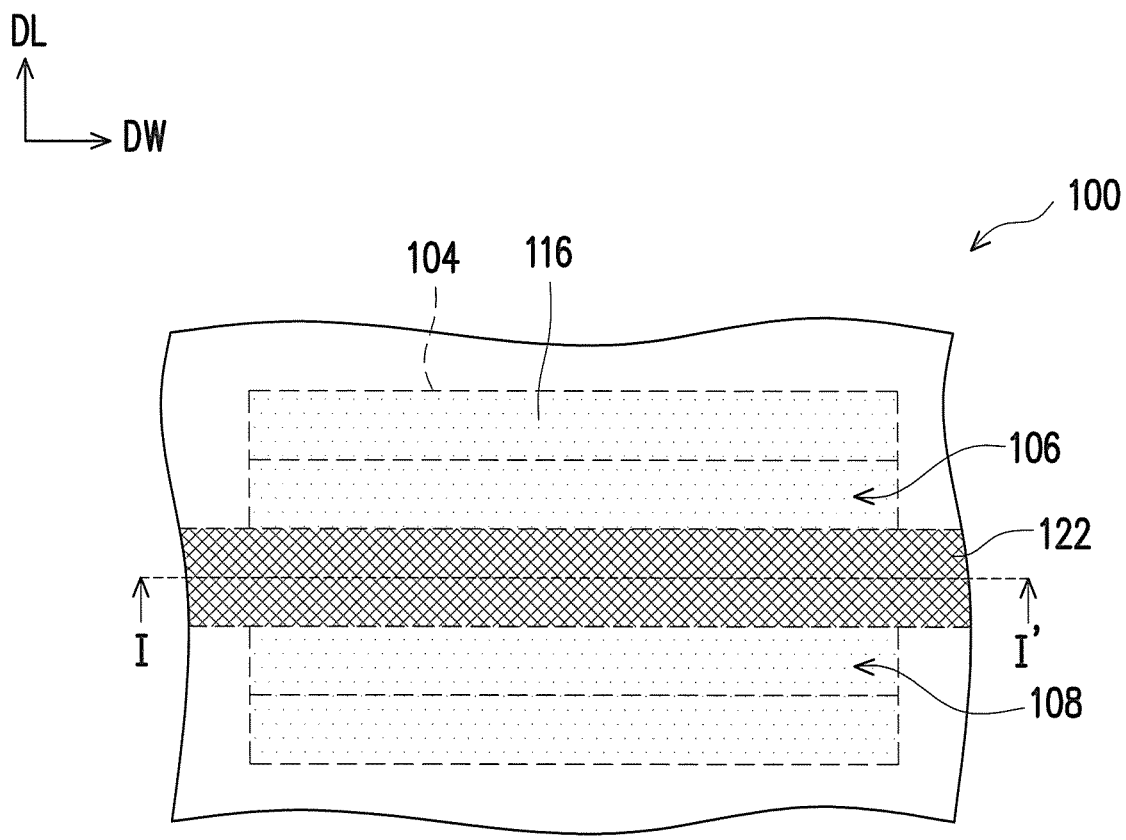
Figure 2A:
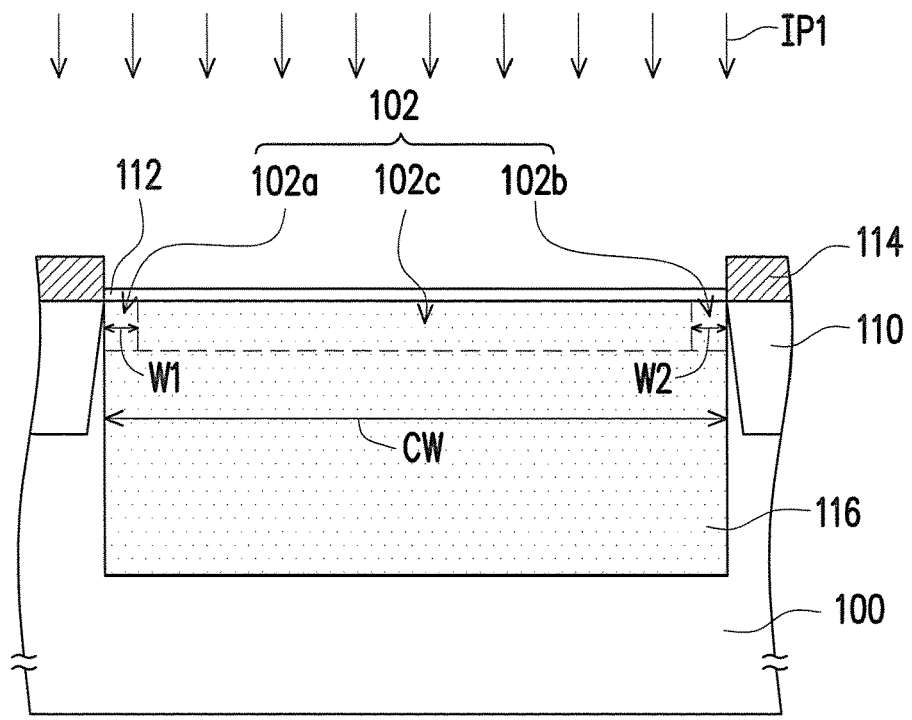
FIG. 2A to FIG. 2C are cross-sectional views along section line I-I' in FIG. 1A to FIG. 1C.
Figure 2B:
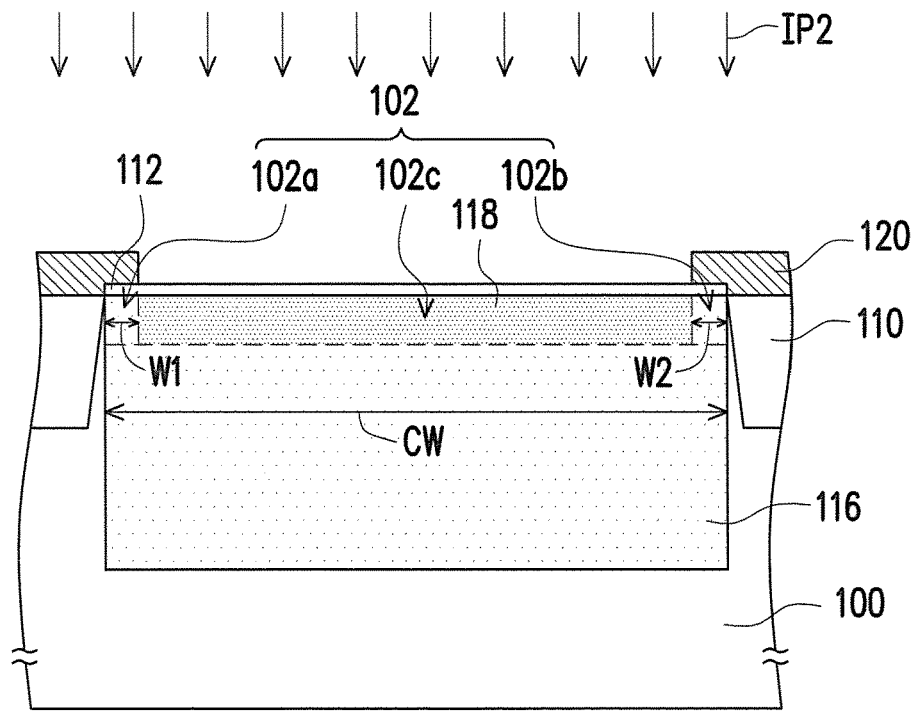
Figure 2C:
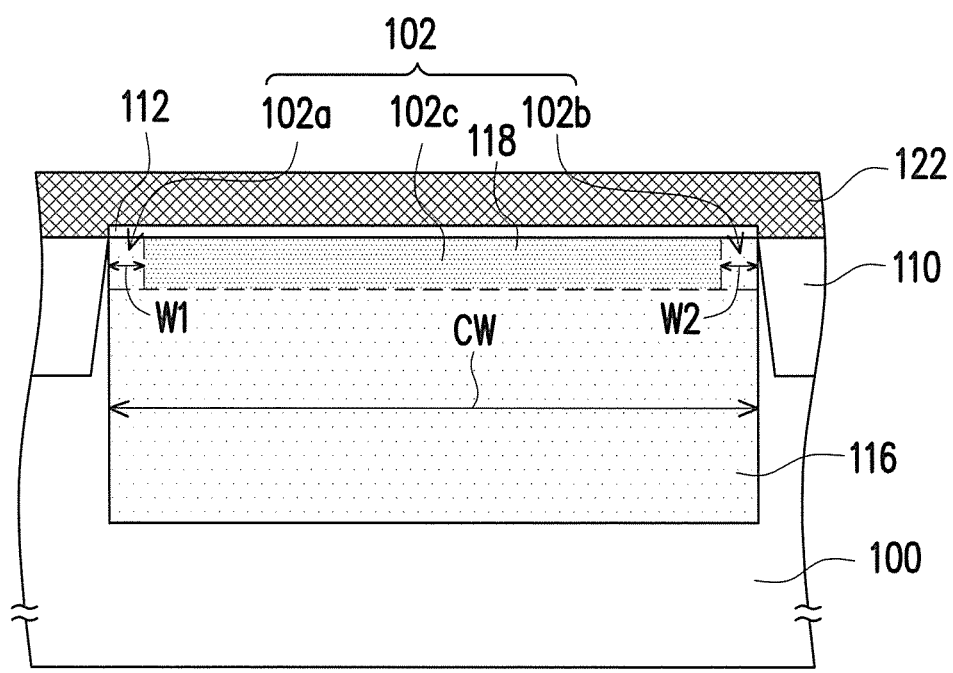

FIG. 1A to FIG. 1C are top views illustrating a doping process for a semiconductor device according to an embodiment of the invention. FIG. 2A to FIG. 2C are cross-sectional views along section line I-I' in FIG. 1A to FIG. 1C. FIG. 1A to FIG. 1C omit the isolation structure and the dielectric layer in FIG. 2A to FIG. 2C to more clearly show the relationships between the other components.

In the doping process for a semiconductor device of this embodiment, the semiconductor device is a high voltage semiconductor device, for example.

Referring to FIG. 1A and FIG. 2A, a substrate 100 is provided. The substrate 100 has a channel region 102. The channel region 102 includes a first edge region 102a, a second edge region 102b and a center region 102c in a channel width direction DW substantially perpendicular to a channel length direction DL, and the center region 102c is located between the first edge region 102a and the second edge region 102b.

The substrate 100 may further have an active region 104, a source region 106 and a drain region 108. The channel region 102, the source region 106 and the drain region 108 may be located in the active region 104. The channel length CL can be usually defined by a distance between the source region 106 and the drain region 108. The channel width CW is substantially equal to a total width of the first edge region 102a, the second edge region 102b and the center region 102c. A ratio of a width W1 of the first edge region 102a to the total width of the first edge region 102a, the second edge region 102b and the center region 102c is 2% to 30%, for example. A ratio of a width W2 of the second edge region 102b to the total width of the first edge region 102a, the second edge region 102b and the center region 102c is 2% to 30%, for example.

Moreover, an isolation structure 110 may be formed in the substrate 100. The isolation structure 110 is a shallow trench isolation (STI) structure, for example. The material of the isolation structure 110 is silicon oxide, for example. A dielectric layer 112 may be formed on the substrate 100. The material of the dielectric layer 112 is silicon oxide, for example.

A first doping process is performed on the first edge region 102a, the second edge region 102b and the center region 102c by using a first conductive type dopant. The first doping process can be used to tune the threshold voltage (Vt) of the semiconductor device. The first conductive type dopant is one of an N-type dopant and a P-type dopant, for example. In this embodiment, the first conductive type dopant is exemplified by the P-type dopant, but the invention is not limited thereto. The first doping process is a well implantation process, for example.

The first doping process may include the following steps, but the invention is not limited thereto. A first patterned photoresist layer 114 exposing an active region 104 is formed on the substrate 100. The first patterned photoresist layer 114 may be formed by performing a lithography process. An ion implantation process IP1 is performed on the active region 104 exposed by the first patterned photoresist layer 114 to forma well region 116.

Referring to FIG. 1B and FIG. 2B, the first patterned photoresist layer 114 is removed after performing the ion implantation process DP1 on the active region 104 exposed by the first patterned photoresist layer 114. The method of removing the first patterned photoresist layer 114 is a dry stripping method or a wet stripping method, for example.

A second doping process is performed on the center region 102c by using a second conductive type dopant. An anti-type doped region 118 can be formed in the center region 102c by the second doping process. The second conductive type dopant is another one of the N-type dopant and the P-type dopant, for example. In this embodiment, the second conductive type dopant is exemplified by the N-type dopant, but the invention is not limited thereto.

Since the second doping process is only performed on the center region 102c, the second doping process can be used to reduce the threshold voltage (Vt) of the center region 102c. Therefore, the threshold voltages (Vt) of the center region 102c, the first edge region 102a and the second edge region 102b can be substantially the same, and the kink effect and the double-hump can be prevented.

The second doping process may include the following steps, but the invention is not limited thereto. A second patterned photoresist layer 120 only exposing the center region 102c is formed. The second patterned photoresist layer 120 may be formed by performing a lithography process. An ion implantation process IP2 is performed on the center region 102c exposed by the second patterned photoresist layer 120.

Referring to FIG. 1C and FIG. 2C, the second patterned photoresist layer 120 is removed after performing the ion implantation process IP2 on the center region 102c exposed by the second patterned photoresist layer 120. The method of removing the second patterned photoresist layer 120 is a dry stripping method or a wet stripping method, for example.

A gate 122 may be formed on the dielectric layer 112 above the channel region 102. The gate 122 may be further extend on the isolation structure 110. The material of the gate 122 is doped polysilicon, for example. The method of forming the gate 122 is a combination of a deposition process, a lithography process, and an etching process, for example.

Based on the above, it is known that in the doping process for the semiconductor device of the above embodiment, since the second doping process is performed on the center region 102c by using the second conductive type dopant (the anti-type type dopant), the kink effect and the double-hump can be prevented. Therefore, the electrical performance and yield of the semiconductor device can be improved.

Figure 3A:
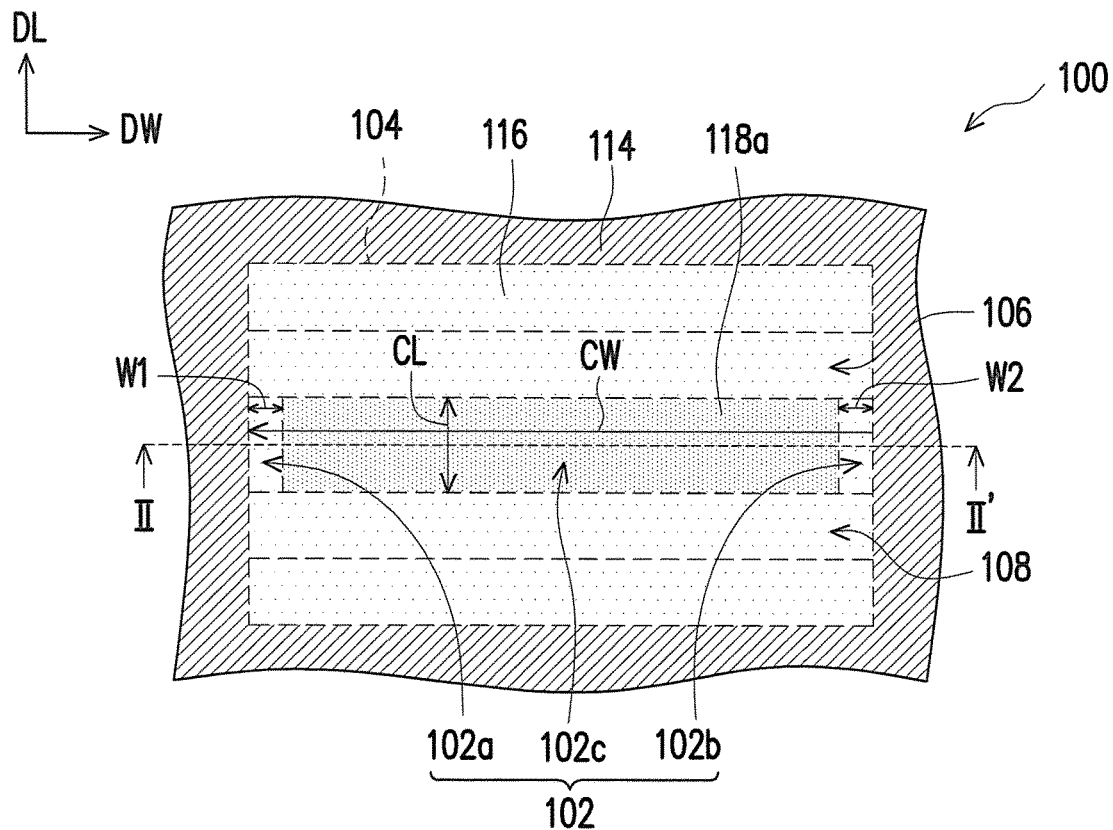
FIG. 3A and FIG. 3B are top views illustrating a doping process for a semiconductor device after the steps of FIG. 1A according to another embodiment of the invention.
Figure 3B:
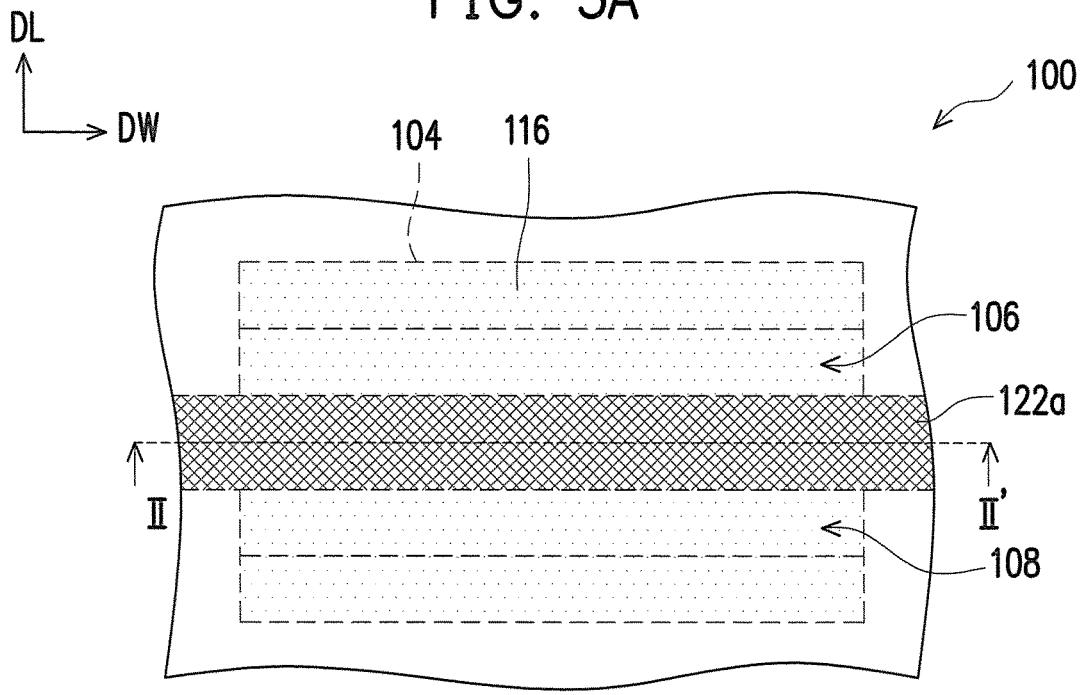
Figure 4A:
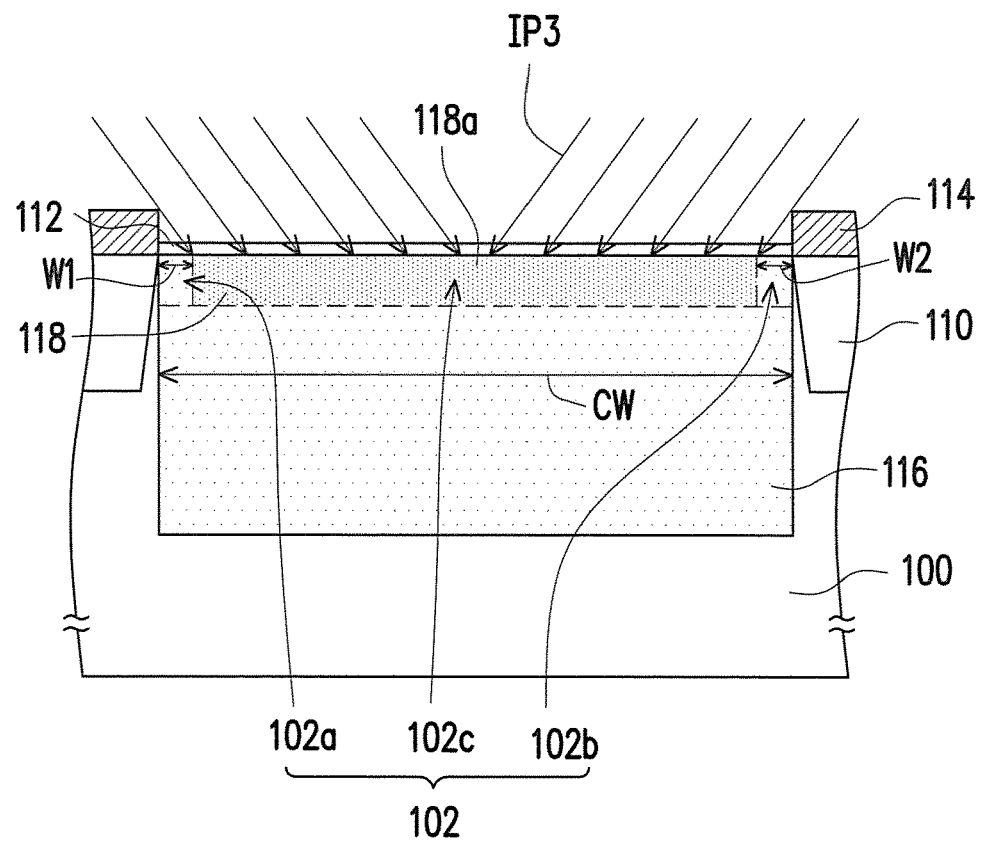
FIG. 4A and FIG. 4B are cross-sectional views along section line II-II' in FIG. 3A and FIG. 3B.
Figure 4B:
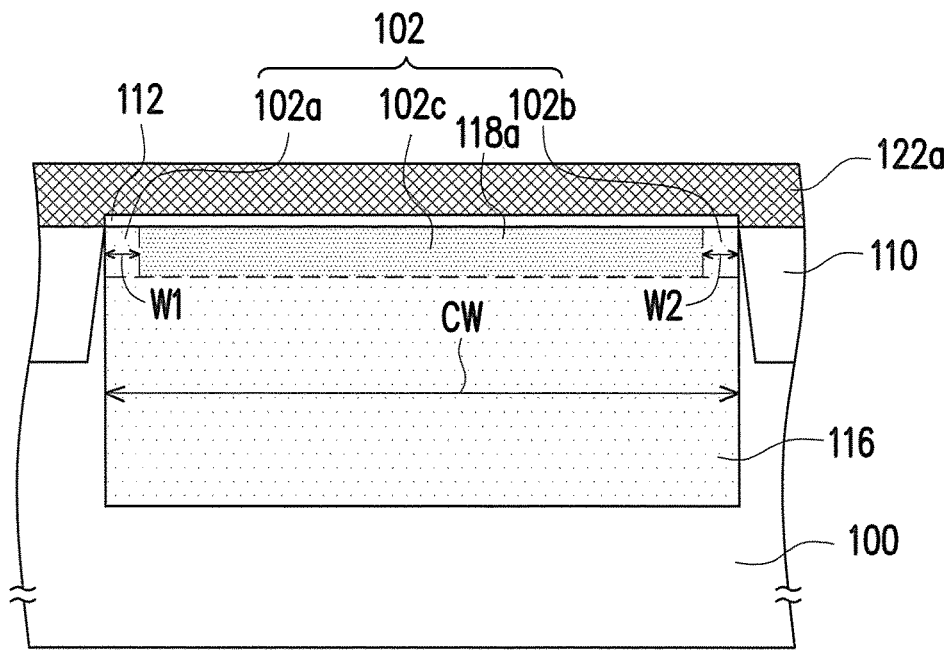

FIG. 3A and FIG. 3B are top views illustrating a doping process for a semiconductor device after the steps of FIG. 1A according to another embodiment of the invention. FIG. 4A and FIG. 4B are cross-sectional views along section line II-II' in FIG. 3A and FIG. 3B. FIG. 3A to FIG. 3B omit the isolation structure and the dielectric layer in FIG. 4A to FIG. 4B to more clearly show the relationships between the other components.

Referring to FIG. 3A and FIG. 4A, after the first doping process is performed on the first edge region 102a, the second edge region 102b and the center region 102c in FIG. 1A and FIG. 2A, a second doping process is performed on the center region 102c by using a second conductive type dopant. An anti-type doped region 118a can be formed in the center region 102c by the second doping process. In this embodiment, the second doping process is exemplified by performing a tilt angle ion implantation process IP3 on the center region 102c exposed by the first patterned photoresist layer 114. Since the second doping process is only performed on the center region 102c, the second doping process can be used to reduce the threshold voltage (Vt) of the center region 102c. Therefore, the threshold voltages (Vt) of the center region 102c, the first edge region 102a and the second edge region 102b can be substantially the same, and the kink effect and the double-hump can be prevented.

Referring to FIG. 3B and FIG. 4B, the first patterned photoresist layer 114 may be removed after performing the tilt angle ion implantation process IP3 on the center region 102c exposed by the first patterned photoresist layer 114.

The method of removing first patterned photoresist layer 114 is a dry stripping method or a wet stripping method, for example.

A gate 122a may be formed on the dielectric layer 112 above the channel region 102. The gate 122a may be further extend on the isolation structure 110. The material of the gate 122a is doped polysilicon, for example. The method of forming the gate 122a is a combination of a deposition process, a lithography process, and an etching process, for example.

In this embodiment, since the first doping process and the second doping process can use the same patterned photoresist layer (i.e., first patterned photoresist layer 114) as the implant mask, the number of the photomask can be reduced and the cost of the manufacturing the semiconductor device can be decreased.

In summary, according to the doping process for the semiconductor device of the above embodiment, since the second doping process is performed on the center region by using the second conductive type dopant (the anti-type type dopant), the kink effect and the double-hump can be prevented. Therefore, the electrical performance and yield of the semiconductor device can be improved.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A doping method for a semiconductor device, comprising:
providing a substrate having a channel region, wherein the channel region comprises a first edge region, a second edge region and a center region in a channel width direction substantially perpendicular to a channel length direction, the center region is located between the first edge region and the second edge region, and the channel length direction is defined by a direction extending through a source region and a drain region;
performing a first doping process on the first edge region, the second edge region and the center region by using a first conductive type dopant; and
performing a second doping process on the center region by using a second conductive type dopant.

2. The doping method for the semiconductor device of claim 1, wherein a ratio of a width of the first edge region to a total width of the first edge region, the second edge region and the center region is 2% to 30%.

3. The doping method for the semiconductor device of claim 1, wherein a ratio of a width of the second edge region to a total width of the first edge region, the second edge region and the center region is 2% to 30%.

4. The doping method for the semiconductor device of claim 1, wherein the first doping process comprises a well implantation process.

5. The doping method for the semiconductor device of claim 1, wherein the first doping process comprises:
forming a first patterned photoresist layer exposing an active region on the substrate, wherein the channel region is located in the active region; and
performing an ion implantation process on the active region exposed by the first patterned photoresist layer.

6. The doping method for the semiconductor device of claim 5, further comprising removing the first patterned photoresist layer after performing the ion implantation process on the active region exposed by the first patterned photoresist layer.

7. The doping method for the semiconductor device of claim 6, wherein the second doping process comprises:
forming a second patterned photoresist layer exposing the center region; and
performing an ion implantation process on the center region exposed by the second patterned photoresist layer.

8. The doping method for the semiconductor device of claim 7, further comprising removing the second patterned photoresist layer after performing the ion implantation process on the center region exposed by the second patterned photoresist layer.

9. The doping method for the semiconductor device of claim 5, wherein the second doping process comprises:
performing a tilt angle ion implantation process on the center region exposed by the first patterned photoresist layer.

10. The doping method for the semiconductor device of claim 9, further comprising removing the first patterned photoresist layer after performing the tilt angle ion implantation process on the center region exposed by the first patterned photoresist layer.

11. The doping method for the semiconductor device of claim 1, wherein the first conductive type dopant is one of an N-type dopant and a P-type dopant.

12. The doping method for the semiconductor device of claim 11, wherein the second conductive type dopant is another one of the N-type dopant and the P-type dopant.

13. The doping method for the semiconductor device of claim 1, wherein the semiconductor device comprises a high voltage semiconductor device.

14. A doping method for a semiconductor device, comprising:
providing a substrate having a channel region, wherein the channel region comprises a first edge region, a second edge region and a center region in a channel width direction substantially perpendicular to a channel length direction, and the center region is located between the first edge region and the second edge region;
performing a first doping process on the first edge region, the second edge region and the center region by using a first conductive type dopant; and
performing a second doping process only on the center region by using a second conductive type dopant.

15. A doping method for a semiconductor device, comprising:
providing a substrate having a channel region, wherein the channel region comprises a first edge region, a second edge region and a center region in a channel width direction substantially perpendicular to a channel length direction, the center region is located between the first edge region and the second edge region, and the channel length direction is defined by a direction extending through a source region and a drain region;
performing a first doping process on the first edge region, the second edge region and the center region by using a first conductive type dopant; and
performing a second doping process on the center region by using a second conductive type dopant, wherein the first doping process and second doping process are performed before forming a gate above the channel region.

* * * * *